US009881797B2

(12) United States Patent
Jagannathan et al.

(10) Patent No.: US 9,881,797 B2
(45) Date of Patent: Jan. 30, 2018

(54) REPLACEMENT GATE ELECTRODE WITH MULTI-THICKNESS CONDUCTIVE METALLIC NITRIDE LAYERS

(71) Applicant: International Business Machines Corporation, Armonk, NY (US)

(72) Inventors: Hemanth Jagannathan, Guilderland, NY (US); Vamsi K. Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 486 days.

(21) Appl. No.: 14/149,088

(22) Filed: Jan. 7, 2014

(65) Prior Publication Data

US 2014/0117466 A1 May 1, 2014

Related U.S. Application Data

(63) Continuation of application No. 13/606,702, filed on Sep. 7, 2012, now Pat. No. 8,741,757, which is a
(Continued)

(51) Int. Cl.
*H01L 21/28* (2006.01)
*H01L 29/51* (2006.01)
(Continued)

(52) U.S. Cl.
CPC .......... *H01L 21/28229* (2013.01); *H01L 21/823842* (2013.01); *H01L 21/823871* (2013.01);
(Continued)

(58) Field of Classification Search
None
See application file for complete search history.

(56) References Cited

U.S. PATENT DOCUMENTS 6,693,313 B2   2/2004  Gonzalez et al.
6,790,731 B2   9/2004  Zheng et al.
(Continued)

OTHER PUBLICATIONS

Hussain, M. M. et al., "Gate-First Integration of Tunable Work Function Metal Gates of Different Thicknesses Into High-k/Metal Gates CMOS FinFETs for Multi-VTh Engineering" IEEE Transactions on Electron Devices (Mar. 2010) pp. 626-631, vol. 57, No. 3.
(Continued)

*Primary Examiner* — Marc Armand
*Assistant Examiner* — Quinton Brasfield
(74) *Attorney, Agent, or Firm* — Scully, Scott, Murphy & Presser, P.C.; Daniel P. Morris, Esq.

(57) ABSTRACT

Gate electrodes having different work functions can be provided by providing conductive metallic nitride layers having different thicknesses in a replacement gate scheme. Upon removal of disposable gate structures and formation of a gate dielectric layer, at least one incremental thickness conductive metallic nitride layer is added within some gate cavities, while not being added in some other gate cavities. A minimum thickness conductive metallic nitride layer is subsequently added as a contiguous layer. Conductive metallic nitride layers thus formed have different thicknesses across different gate cavities. A gate fill conductive material layer is deposited, and planarization is performed to provide multiple gate electrode having different conductive metallic nitride layer thicknesses. The different thicknesses of the conductive metallic nitride layers can provide different work functions having a range of about 400 mV.

12 Claims, 14 Drawing Sheets

Related U.S. Application Data continuation of application No. 13/406,784, filed on Feb. 28, 2012, now Pat. No. 9,202,698.

(51) Int. Cl.
*H01L 21/8238* (2006.01)
*H01L 27/092* (2006.01)
*H01L 23/485* (2006.01)
*H01L 21/84* (2006.01)

(52) U.S. Cl.
CPC .......... *H01L 21/845* (2013.01); *H01L 23/485* (2013.01); *H01L 27/092* (2013.01); *H01L 29/518* (2013.01); *H01L 2924/0002* (2013.01)

(56) References Cited

U.S. PATENT DOCUMENTS

| | | | |
|---|---|---|---|
| 6,846,734 B2 | 1/2005 | Amos et al. | |
| 7,153,784 B2* | 12/2006 | Brask | H01L 21/82345 257/E21.637 |
| 7,378,713 B2 | 5/2008 | Hsu et al. | |
| 7,754,594 B1 | 7/2010 | Chudzik et al. | |
| 2007/0001246 A1* | 1/2007 | Lim | H01L 21/28061 257/412 |
| 2007/0037343 A1* | 2/2007 | Colombo | H01L 21/823842 257/E21.637 |
| 2007/0075351 A1 | 4/2007 | Schulz et al. | |
| 2007/0178634 A1 | 8/2007 | Jung et al. | |
| 2009/0294800 A1* | 12/2009 | Cheng | H01L 21/823412 257/192 |
| 2010/0176456 A1* | 7/2010 | Ikeno | H01L 21/823857 257/369 |
| 2012/0181630 A1 | 7/2012 | Ando et al. | |
| 2012/0256276 A1 | 10/2012 | Hwang et al. | |
| 2013/0026579 A1 | 1/2013 | Lu et al. | |
| 2013/0075827 A1* | 3/2013 | Lee | H01L 29/4966 257/369 |

OTHER PUBLICATIONS

Choi, K. et al., "The Effect of Metal Thickness, Overlayer and High-k Surface Treatment on the Effective Work Function of Metal Electrode" Proceedings of 35th European Solid-State Device Research Conference, ESSDERC 2005 (Sep. 12-16, 2005) pp. 101-104.

Ferain, I. et al., "Metal Gate Thickness Optimization for MuGFET Performance Improvement" 38th European Solid-State Device Research Conference, ESSDERC 2008 (Sep. 15-19, 2008) pp. 202-205.

Singanamalla, R. et al., "On the Impact of TiN Film Thickness Variations on the Effective Work Function of Poly-Si/TiN/SiO2 and Poly-Si/TiN/HfSiON Gate Stacks" IEEE Electron Device Letters (May 2006) pp. 332-334, vol. 27, No. 5.

Office Action dated Jun. 11, 2014 received in U.S. Appl. No. 13/406,784.

* cited by examiner

REPLACEMENT GATE ELECTRODE WITH MULTI-THICKNESS CONDUCTIVE METALLIC NITRIDE LAYERS

CROSS REFERENCE TO RELATED APPLICATION

This application is a continuation of U.S. patent application Ser. No. 13/606,702 filed on Sep. 7, 2012, which is a continuation of U.S. patent application Ser. No. 13/406,784, filed Feb. 28, 2012 the entire content and disclosure of which is incorporated herein by reference.

BACKGROUND

The present disclosure generally relates to semiconductor devices, and particularly to semiconductor structures including multi-thickness conductive metallic nitride layers providing multiple work functions, and methods of manufacturing the same.

In complementary metal oxide semiconductor (CMOS) replacement gate integration schemes, multiple work functions are needed in gate electrodes in order to provide optimal threshold voltages to various field effect transistors. Because satisfactory operation of p-type field effect transistors (PFETs) and n-type field effect transistors (NFETs) in a CMOS circuit require gate electrodes having work functions that differ by at least 300 mV~400 mV, a variety of work function metals are used in order to obtain a set of desired workfunctions on various CMOS devices in replacement gate integration schemes. However, such work function metals tend not to provide sufficiently low resistivity, thereby requiring deposition of additional fill metals with low resistivity. Thus, typical replacement gate electrodes include a stack of about 4-5 layers of different metals. With the scaling of semiconductor devices to the 22 nm node and the 15 nm node, filling narrow gate cavities employing a stack of different conductive material layers becomes more challenging.

SUMMARY

Gate electrodes having different work functions can be provided by providing conductive metallic nitride layers having different thicknesses in a replacement gate scheme. Upon removal of disposable gate structures and formation of a gate dielectric layer, at least one incremental thickness conductive metallic nitride layer is added within some gate cavities, while not being added in some other gate cavities. A minimum thickness conductive metallic nitride layer is subsequently added as a contiguous layer. Conductive metallic nitride layers thus formed have different thicknesses across different gate cavities. A gate fill conductive material layer is deposited, and planarization is performed to provide multiple gate electrode having different conductive metallic nitride layer thicknesses. The different thicknesses of the conductive metallic nitride layers can provide different work functions having a range of about 400 mV.

According to an aspect of the present disclosure, a semiconductor structure including at least two field effect transistors is provided. The semiconductor structure includes: a first field effect transistor including a first gate dielectric and a first gate electrode, wherein the first gate electrode includes a first conductive metallic nitride layer having a first thickness and in contact with the first gate dielectric; and a second field effect transistor including a second gate dielectric and a second gate electrode, wherein the second gate electrode includes a second conductive metallic nitride layer having a second thickness that is less than the first thickness and in contact with the second gate dielectric.

According to another aspect of the present disclosure, a method of forming a semiconductor structure is provided. The method includes: forming a first gate cavity and a second gate cavity above a semiconductor portion, wherein each of the first gate cavity and the second gate cavity is laterally surrounded by a planarization dielectric layer, wherein a top surface of the semiconductor portion is exposed at a bottom of each of the first and second gate cavities; forming a gate dielectric layer within the first and second gate cavities; forming a component conductive metallic nitride layer on the gate dielectric layer; removing the component conductive metallic nitride layer from above a second portion of the gate dielectric layer within the second gate cavity, while the component conductive metallic nitride layer is not removed from above a first portion of the gate dielectric layer within the first gate cavity; forming another component conductive metallic nitride layer on the second portion of the gate dielectric layer and on a portion of the component conductive metallic nitride layer in contact with the first portion of the gate dielectric layer; and filling the first gate cavity and the second gate cavity with a conductive material, wherein a first conductive material portion is formed within the first gate cavity and a second conductive material portion is formed within the second gate cavity.

DETAILED DESCRIPTION

Figure 1:
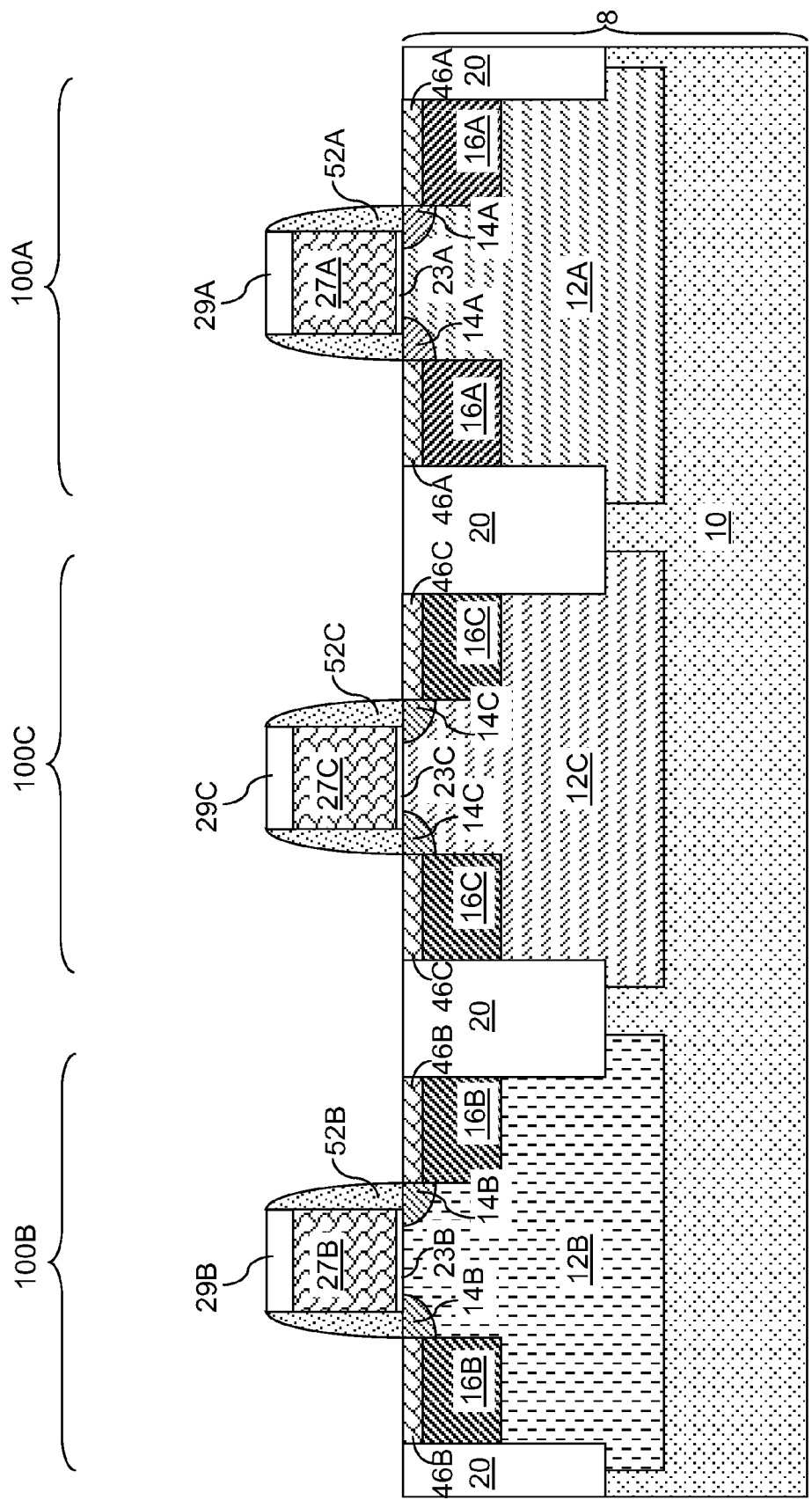
FIG. 1 is vertical cross-sectional view of a first exemplary semiconductor structure after formation of disposable gate structures, source/drain extension regions, source/drain regions, and source/drain metal semiconductor alloy portions according to a first embodiment of the present disclosure.

As stated above, the present disclosure relates to semiconductor devices, and particularly to semiconductor structures including multi-thickness conductive metallic nitride layers providing multiple work functions, and methods of manufacturing the same, which are now described in detail with accompanying figures. Like and corresponding elements mentioned herein and illustrated in the drawings are referred to by like reference numerals. The drawings are not necessarily drawn to scale.

As used herein, "a," "one," "another," "even another," "yet another," "still another," or other grammatical determiners are employed to distinguish one element from another element. As such, an element identified by a particular grammatical determiner in claims may, or may not, correspond to an element in the specification that employs the same grammatical determiner.

As used herein, "first," "second," "third," and other ordinals are employed to distinguish one element from another element. As such, an element identified by a particular ordinal in claims may, or may not, correspond to an element in the specification that employs the same ordinal.

Referring to FIG. 1, a first exemplary semiconductor structure according to a first embodiment of the present disclosure includes a semiconductor substrate 8, on which various components of field effect transistors are subsequently formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of n-type or p-type at different dopant concentration levels. For example, a first doped well 12A can be formed in a portion of the semiconductor substrate 8 in a first device region 100A, a second doped well 12B can be formed in a portion of the semiconductor substrate in a second device region 100B, and a third doped well 12C can be formed in a portion of the semiconductor substrate 8 in a third semiconductor device region 100C. The first, second, and third doped wells (12A, 12B, 12C) can be independently doped with p-type dopants or n-type dopants.

Shallow trench isolation structures 20 are formed to laterally separate the doped wells (12A, 12B, 12C) in different device regions (100A, 100B, 100C). Typically, each of the doped wells (12A, 12B, 12C) is laterally surrounded by a contiguous portion of the shallow trench isolation structures 20. If the semiconductor substrate 8 is a semiconductor-on-insulator substrate, bottom surfaces of each doped well (12A, 12B, 12C) may contact a buried insulator layer (not shown), which electrically isolates each of the doped wells (12A, 12B, 12C) from other semiconductor portions of the semiconductor substrate 8 in conjunction with the shallow trench isolation structures 20. In one embodiment, topmost surfaces of the shallow trench isolation structures can be substantially coplanar with topmost surfaces of the doped wells (12A, 12B, 12C).

Disposable gate level layers are deposited on the semiconductor substrate 8 as blanket layers, i.e., as unpatterned contiguous layers. The disposable gate level layers can include, for example, a vertical stack of a disposable gate dielectric layer (not shown), a disposable gate material layer (not shown), and a disposable gate cap dielectric layer (not shown). The disposable gate dielectric layer can be, for example, a layer of silicon oxide, silicon nitride, or silicon oxynitride. The thickness of the disposable gate dielectric layer can be from 1 nm to 10 nm, although lesser and greater thicknesses can also be employed. The disposable gate material layer includes a material that can be subsequently removed selective to the dielectric material of a planarization dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. While the present disclosure is illustrated with disposable gate level layers including a vertical stack of a disposable gate dielectric layer, a disposable gate material layer, and a disposable gate cap dielectric layer, any other disposable gate level layers can also be employed provided that the material(s) in the disposable gate level layers can be removed selective to a planarization dielectric layer to be subsequently formed.

The disposable gate level layers are lithographically patterned to form disposable gate structures. Specifically, a photoresist (not shown) is applied over the topmost surface of the disposable gate level layers and is lithographically patterned by lithographic exposure and development. The pattern in the photoresist is transferred into the disposable gate level layers by an etch, which can be an anisotropic etch such as a reactive ion etch. The remaining portions of the disposable gate level layers after the pattern transfer constitute disposable gate structures.

The disposable gate stacks may include, for example, a first disposable gate structure formed over the first doped well 12A in the first device region 100A, a second disposable gate structure formed over the second doped well 12B in the second device region 100B, and a third disposable gate structure formed over the third doped well 12C in the third device region 100C. The first disposable gate structure can be a stack of a first disposable gate dielectric portion 23A, a first disposable gate material portion 27A, and a first disposable gate cap portion 29A. The second disposable gate structure can be a stack of a second disposable gate dielectric portion 23B, a second disposable gate material portion 27B, and a second disposable gate cap portion 29B. The third disposable gate structure can be a stack of a third disposable gate dielectric portion 23C, a third disposable gate material portion 27C, and a third disposable gate cap portion 29C. The first disposable gate cap portion 29A, the second disposable gate cap portion 29B, and the third disposable gate cap portion 29C are remaining portions of the disposable gate cap dielectric layer. The first disposable gate material portion 27A, the second disposable gate material portion 27B, and the third disposable gate material portion 27C are remaining portions of the disposable gate material layer. The first disposable gate dielectric portion 23A, the second disposable gate dielectric portion 23B, and the third disposable gate dielectric portion 23C are remaining portions of the disposable gate dielectric layer.

Masked ion implantations can be employed to form various source/drain extension regions. For example, electrical dopants (e.g., p-type dopants or n-type dopants) can be implanted into portions of the first doped well 12A that are not covered by the first disposable gate structure (23A, 27A, 29A) to form first source/drain extension regions 14A. The second doped well 12B and/or the third doped well 12C can be masked by a patterned photoresist (not shown) during this implantation process to prevent implantation of additional dopants of the first conductivity type therein. As used herein, "source/drain extension regions" collectively refer to source extension regions and drain extension regions. Similarly, additional dopants can be implanted into portions of the second doped well 12B that are not covered by the second disposable gate structure (23B, 27B, 29B) to form second source/drain extension regions 14B. Likewise, yet additional dopants can be implanted into portions of the third doped well 12C that are not covered by the third disposable gate structure (23B, 27B, 29B) to form third source/drain extension regions 14C. The various electrical dopants can independently be p-type dopants or n-type dopants.

Gate spacers are formed on sidewalls of each of the disposable gate structures, for example, by deposition of a conformal dielectric material layer and an anisotropic etch. The gate spacers can include a first gate spacer 52A formed around the first disposable gate structure (23A, 27A, 29A), a second gate spacer 52B formed around the second disposable gate structure (23B, 27B, 29B), and a third gate spacer 52C formed around the third disposable gate structure (23C, 27C, 29C).

Source/drain regions are formed in each of the first, second, and third doped wells (12A, 12B, 12C). The source/drain regions can include, for example, first source/drain regions 16A formed within the first device region 100A, second source/drain regions 16B formed within the second device region 100B, and third source/drain regions 16C formed within the third device region 100C.

In one embodiment, the source/drain regions can be formed by masked ion implantation in which a combination of a patterned mask layer (such as a patterned photoresist layer), the disposable gate structures, and the gate spacers (52A, 52B, 52C) functions as an implantation mask. In one embodiment, semiconductor material can be removed from the portions of the semiconductor substrate that are not covered by the disposable gate structures, gate spacers (52A, 52B, 52C), or the shallow trench isolation structures 20 to form cavities within the semiconductor substrate 8. For example, source/drain cavities (not shown) can be formed in one or more of the various device regions (100A, 100B, 100C), and filled with a semiconductor material that is different material of the doped well (12A, 12B, and/or 12C). Source/drain regions can be formed by doping the semiconductor material that fills the source/drain cavities by in-situ doping during deposition of the semiconductor material, or by ex-situ doping after deposition of the semiconductor material.

Various metal semiconductor alloy portions can be formed. For example, first metal semiconductor alloy portions 46A, second metal semiconductor alloy portions 46B, and third metal semiconductor alloy portions 46C can be formed on exposed semiconductor material on the top surface of the semiconductor substrate 8, for example, by deposition of a metal layer (not shown) and an anneal. Unreacted portions of the metal layer are removed selective to reacted portions of the metal layer. The reacted portions of the metal layer constitute the metal semiconductor alloy portions (46A, 46B, 46C), which can include a metal silicide portions if the semiconductor material of the first and second source and drain regions (16A, 16B, 16C) include silicon.

Figure 2:
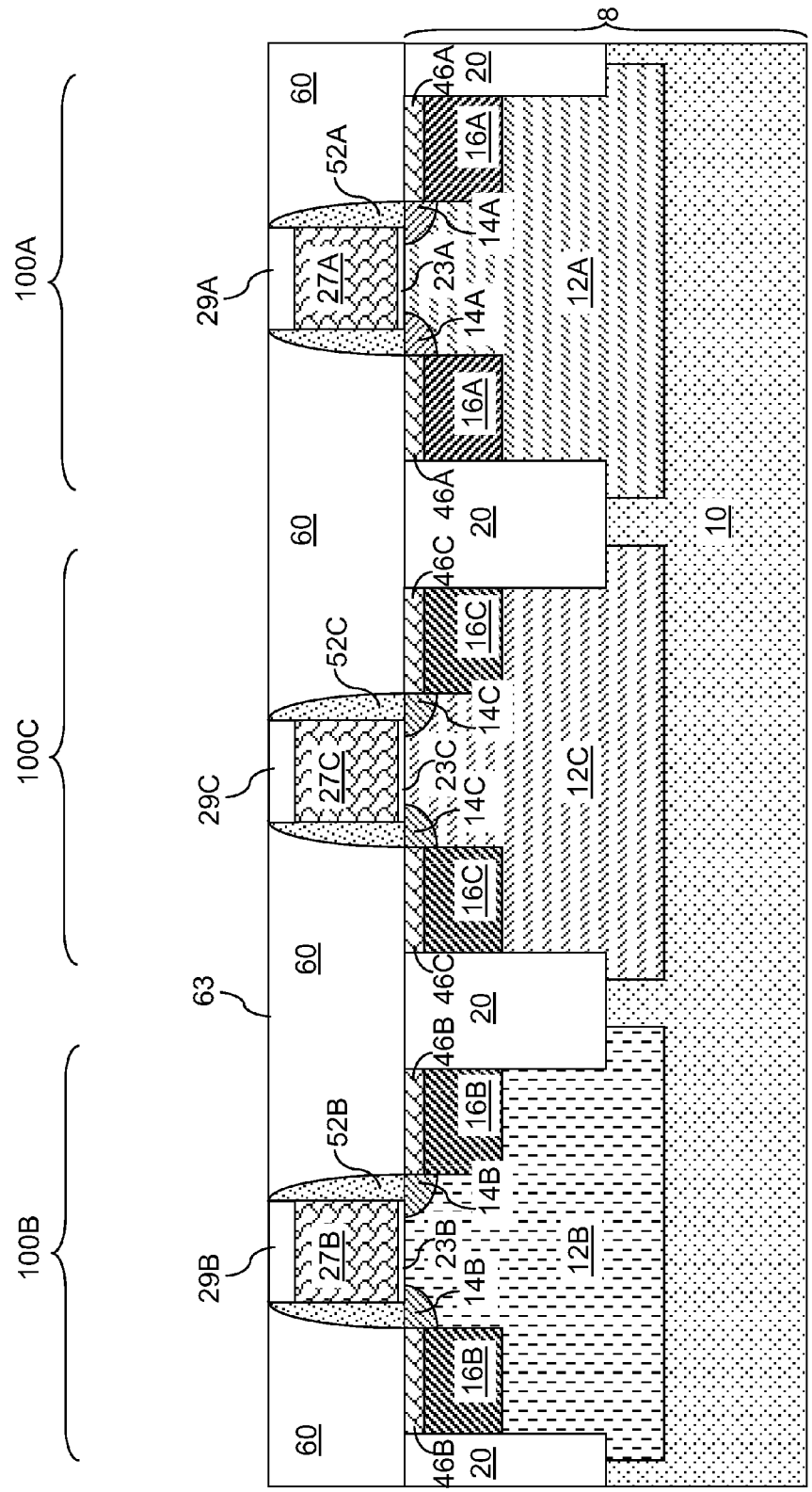
FIG. 2 is a vertical cross-sectional view of the first exemplary semiconductor structure after deposition and planarization of a planarization dielectric layer according to the first embodiment of the present disclosure.

Referring to FIG. 2, a planarization dielectric layer 60 can be deposited over the first, second, and third metal semiconductor alloy portions (46A, 46B, 46C), the first, second, and third disposable gate structures (23A, 27A, 29A, 23B, 27B, 29B, 23C, 27C, 29C), and the first, second, and third gate spacers (52A, 52B, 52C). Preferably, the planarization dielectric layer 60 is a dielectric material that may be easily planarized. For example, the planarization dielectric layer 60 can include at least one of silicon nitride, a doped silicate glass, and an undoped silicate glass (silicon oxide).

The planarization dielectric layer 60 is planarized above the topmost surfaces of the first, second, and third disposable gate structures (23A, 27A, 29A, 23B, 27B, 29B, 23C, 27C, 29C), i.e., above the topmost surfaces of the first, second, and third disposable gate cap portions (29A, 29B, 29C). The planarization can be performed, for example, by chemical mechanical planarization (CMP). The planar topmost surface of the planarization dielectric layer 60 is herein referred to as a planar dielectric surface 63. The topmost surfaces of the disposable gate cap portions (29A, 29B, 29C) are coplanar with the planar dielectric surface 63 after the planarization.

The combination of the first source and drain extension regions 14A, the first source and drain regions 16A, and the first doped well 12A can be employed to subsequently form a first field effect transistor. The combination of the second source and drain extension regions 14B, the second source and drain regions 16B, and the second doped well 12B can be employed to subsequently form a second field effect transistor. The combination of the third source and drain extension regions 14C, the third source and drain regions 16C, and the third doped well 12C can be employed to subsequently form a third field effect transistor.

Figure 3:
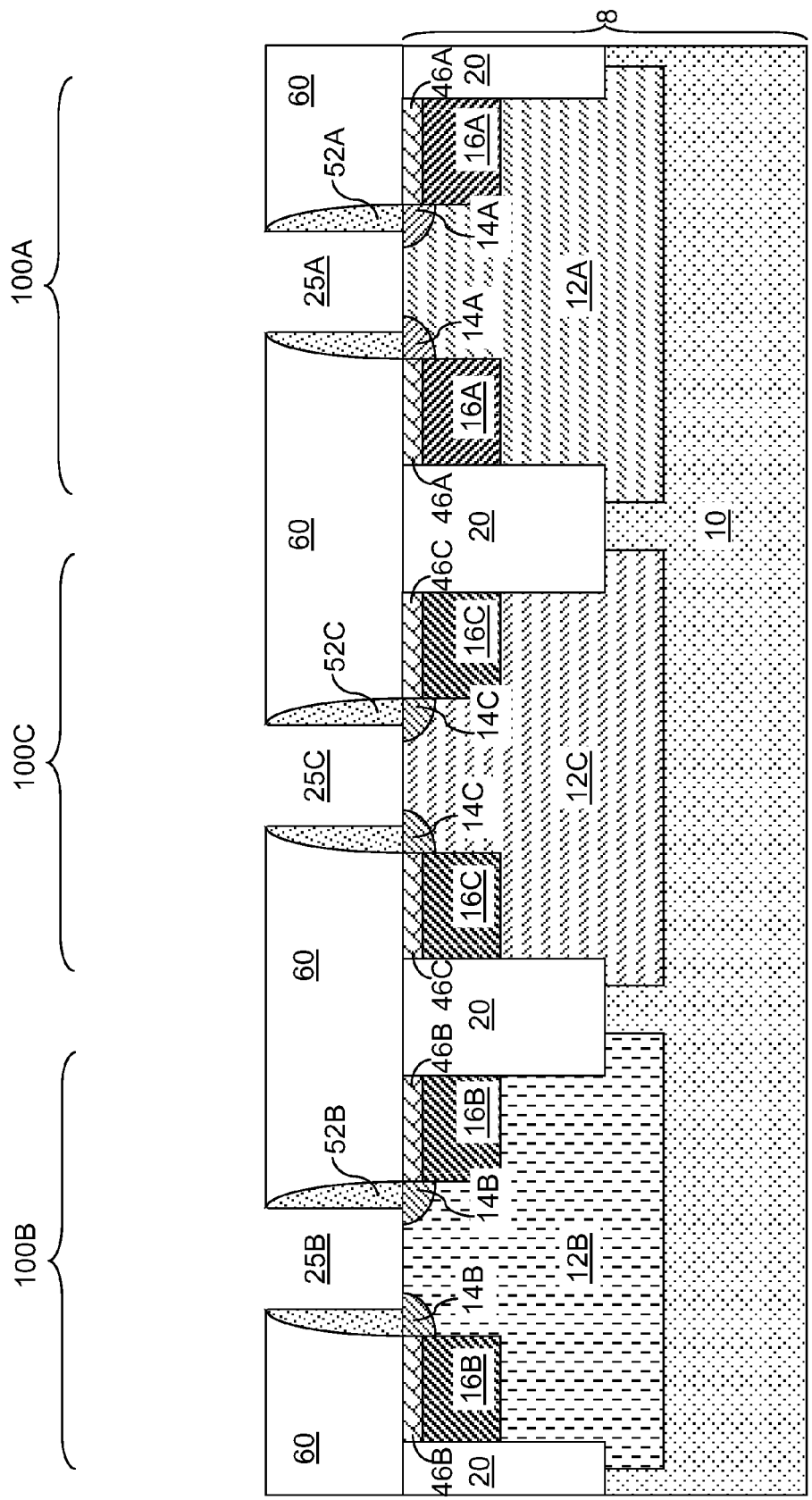
FIG. 3 is a vertical cross-sectional view of the first exemplary semiconductor structure after removal of the disposable gate structures according to the first embodiment of the present disclosure.

Referring to FIG. 3, the first disposable gate structure (23A, 27A, 29A), the second disposable gate structure (23B, 27B, 29B), and the third disposable gate structure (23C, 27C, 29C) are removed by at least one etch. The first, second, and third disposable gate structures (23A, 27A, 29A, 23B, 27B, 29B, 23C, 27C, 29C) can be removed, for example, by at least one etch, which can include an anisotropic etch, an isotropic etch, or a combination thereof. The at least one etch can include a dry etch and/or a wet etch. The at least one etch employed to remove the first, second, and third disposable gate structures (23A, 27A, 29A, 23B, 27B, 29B, 23C, 27C, 29C) is preferably selective to the dielectric materials of the planarization dielectric layer 60 and any other dielectric material layer that is present above the semiconductor substrate 8.

A first gate cavity 25A is formed in the volume from which the first disposable gate structure (23A, 27A, 29A) is removed. A second gate cavity 25B is formed in the volume from which the second disposable gate structure (23B, 27B, 29B) is removed. A third gate cavity 25B is formed in the volume from which the third disposable gate structure (23C, 27C, 29C) is removed. A semiconductor surface of the semiconductor substrate 8, i.e., the top surface of the first doped well 12A, is exposed at the bottom of the first gate cavity 25A. Another semiconductor surface of the semiconductor substrate 8, i.e., the top surface of the second doped well 12B, is exposed at the bottom of the second gate cavity 25B. Yet another semiconductor surface of the semiconductor substrate 8, i.e., the top surface of the third doped well 12C, is exposed at the bottom of the third gate cavity 25C. Each of the first, second, and third gate cavities (25A, 25B, 25C) is laterally surrounded by the planarization dielectric layer 60. The first gate spacer 52A laterally surrounds the first gate cavity 25A, the second gate spacer 52B laterally surrounds the second gate cavity 25B, and the third gate spacer 52C laterally surrounds the third gate cavity 25C. The inner sidewalls of the first gate spacer 52A can be substantially vertical, and extends from the top surface of the first doped well 12A to the planar dielectric surface 63, i.e., the topmost surface, of the planarization dielectric layer 60. Further, the inner sidewalls of the second gate spacer 52B can be substantially vertical, and extends from the top surface of the second doped well 12B to the planar dielectric surface 63 of the planarization dielectric layer 60. Yet further, the inner sidewalls of the third gate spacer 52C can be substantially vertical, and extends from the top surface of the third doped well 12C to the planar dielectric surface 63 of the planarization dielectric layer 60.

Figure 4:
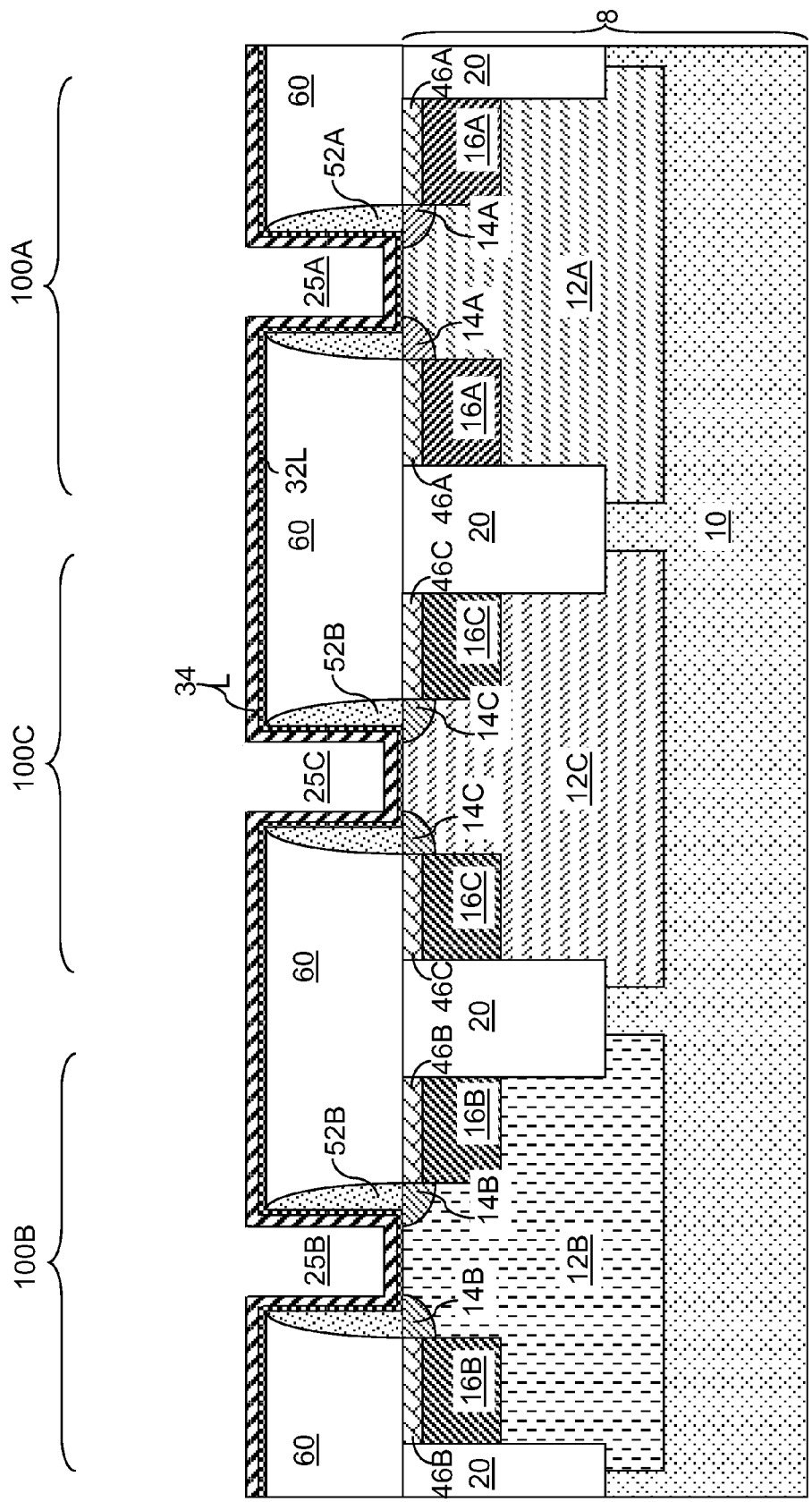
FIG. 4 is a vertical cross-sectional view of the first exemplary semiconductor structure after formation of a gate dielectric layer and a first component conductive metallic nitride layer according to the first embodiment of the present disclosure.

Referring to FIG. 4, a gate dielectric layer 32L is deposited on the bottom surfaces and sidewalls of the gate cavities (25A, 25B) and the topmost surface of the planarization dielectric layer 60. The gate dielectric layer 32L is formed within the first, second, and third gate cavities (25A, 25B, 25C). The gate dielectric layer 32L can be formed as a contiguous layer that extends over the entirety of top surfaces of the planarization dielectric layer 60 and all surfaces within the gate cavities (25A, 25B, 25C). The gate dielectric layer 32L can be a high dielectric constant (high-k) material layer having a dielectric constant greater than 3.9. The gate dielectric layer 32L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 32L, as measured at horizontal portions, can be from 0.9 nm to 6 nm, and preferably from 1.0 nm to 3 nm. The gate dielectric layer 32L may have an effective oxide thickness on the order of or less than 2 nm. In one embodiment, the gate dielectric layer 32L is a hafnium oxide ($HfO_2$) layer.

A first component conductive metallic nitride layer 34L including a conductive metallic nitride material is subsequently deposited. As used herein, a "component" layer refers to a layer that stands alone as a distinct layer, or becomes a component of another layer. In one embodiment, the first component conductive metallic nitride layer 34L consists essentially of at least one first metal and N, and has a first atomic ratio of the at least one first metal to N. The at least one first metal can be an elemental metal of Ti, an elemental metal of Ta, an elemental metal of W, or any combination thereof.

In one embodiment, the first atomic ratio of the at least one first metal to N can be from 0.2 to 5. In another embodiment, the first atomic ratio of the at least one first metal to N can be from 0.4 to 0.6. In yet another embodiment, the first atomic ratio can be from 0.45 to 0.55.

The first component conductive metallic nitride layer 34L can be deposited, for example, by atomic layer deposition (ALD), physical vapor deposition (PVD) or chemical vapor deposition (CVD). The first component conductive metallic nitride layer 34L may, or may not, be conformal. In other words, the vertical portions of the first component conductive metallic nitride layer 34L may, or may not, have the same thickness as the horizontal portions of the first component conductive metallic nitride layer 34L. The first component conductive metallic nitride layer 34L has a same composition throughout, which is herein referred to as a first composition. The thickness of the horizontal portions of the first component conductive metallic nitride layer 34L at the bottom of the first, second, and third gate cavities (25A, 25B, 25C) can be from 0.5 nm to 3.0 nm, although lesser and greater thicknesses can also be employed.

Figure 5:
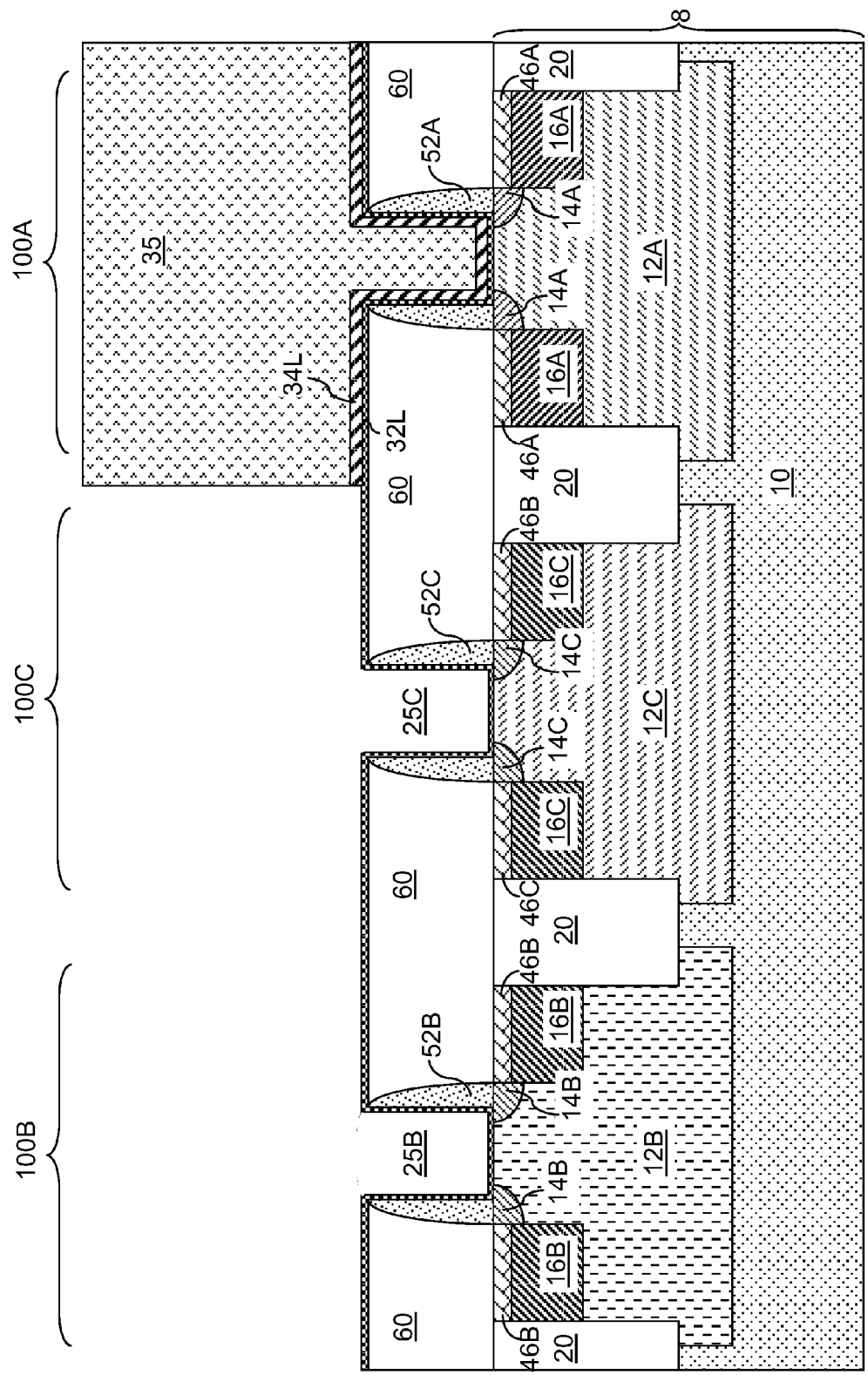
FIG. 5 is a vertical cross-sectional view of the exemplary semiconductor structure after patterning of the first component conductive metallic nitride layer according to the first embodiment of the present disclosure.

Referring to FIG. 5, the first component conductive metallic nitride layer 34L is patterned so that the first component conductive metallic nitride layer 34L is removed from the second and third device regions (100B, 100C), while a portion of the first component conductive metallic nitride layer 34L remains in the first device region 100A. For example, a first photoresist 35 can be applied and lithographic patterned so that the first photoresist 35 covers the area over the first doped well 12A in the first device region 100A, while the first component conductive metallic nitride layer 34L is exposed, i.e., physically exposed, over the second and third doped wells (12B, 12C) in the second and third device regions (100B, 100C). The exposed portion of the first component conductive metallic nitride layer 34L is removed by an etch, which can be a wet etch or a dry etch. Thus, the first component conductive metallic nitride layer 34L is removed from above a second portion of the gate dielectric layer 32L within the second gate cavity 25B and from above a third portion of the gate dielectric layer 32L within the third gate cavity 25C, while the first component conductive metallic nitride layer 32L is not removed from above a first portion of the gate dielectric layer 32L within the first gate cavity 25A (See FIG. 4). The first photoresist 35 is removed, for example, by ashing or wet etching.

Figure 6:
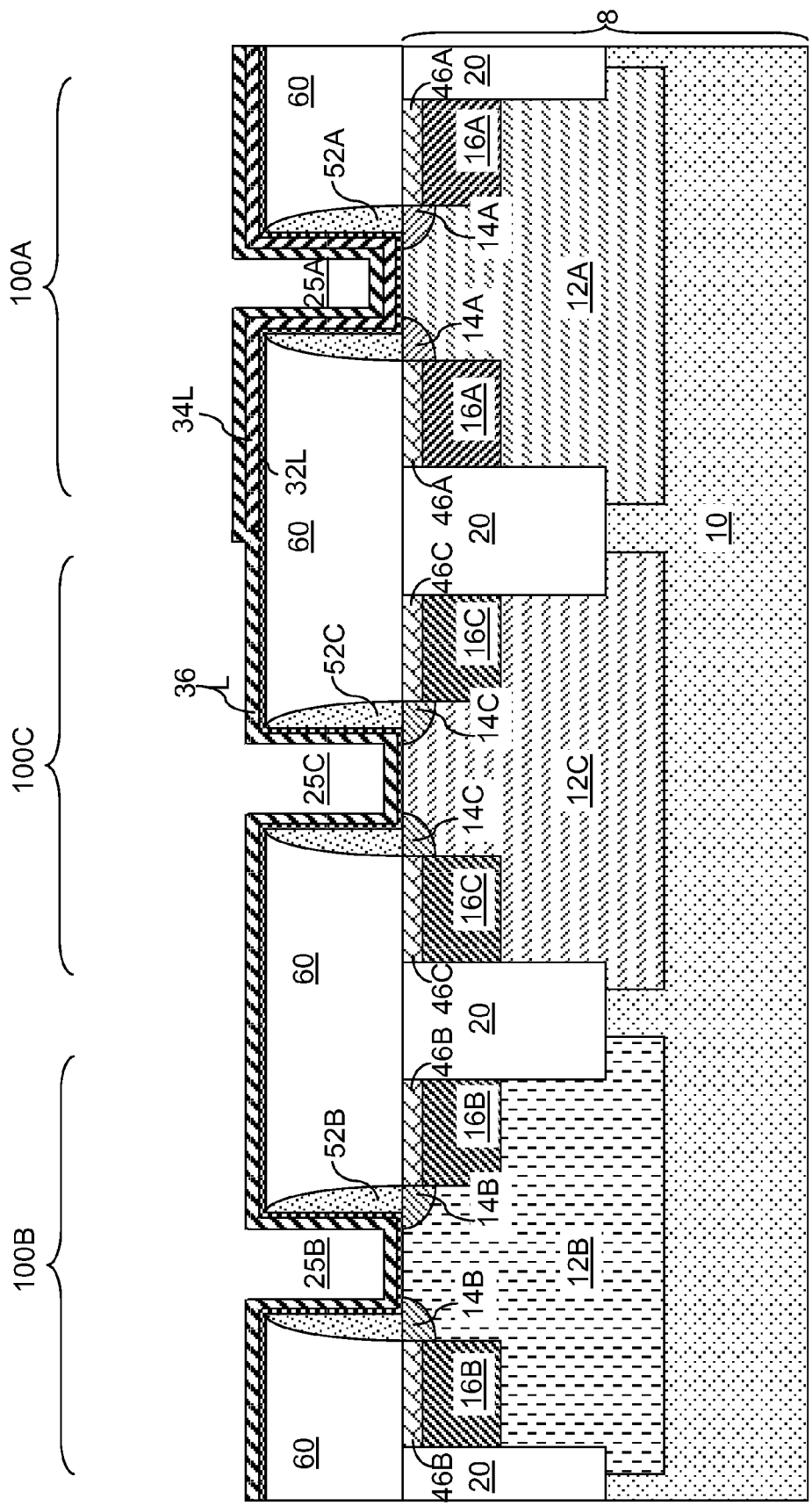
FIG. 6 is a vertical cross-sectional view of the first exemplary semiconductor structure after formation of a second component conductive metallic nitride layer according to the first embodiment of the present disclosure.

Referring to FIG. 6, a second component conductive metallic nitride layer 36L is subsequently deposited. In one embodiment, the second component conductive metallic nitride layer 36L consists essentially of at least one second metal and N, and has a second atomic ratio of the at least one second metal to N. The at least one second metal can be an elemental metal of Ti, an elemental metal of Ta, an elemental metal of W, or any combination thereof. In one embodiment, the at least one second metal can be an identical set of a single metal or multiple metals as the at least one first metal. For example, the at least one first metal and the at least one second metal can be Ti, Ta, W, a set including Ti and Ta, a set including Ti and W, a set including Ta and W, or a set including Ti, Ta, and W. In another embodiment, the at least one second metal can be a different set of a single metal or multiple metals from the at least one first metal. For example, one of the at least one first metal may include an element selected from Ti, Ta, and W, and the other of the at least one second metal may not include that selected element. Further, if the at least one first metal and/or the at least one second metal includes a plurality of elemental metals, the ratio among the plurality of elemental metals can be the same, or different, between the at least one first metal and the at least one second metal.

In one embodiment, the second atomic ratio of the at least one second metal to N can be from 0.2 to 0.5. In another embodiment, the second atomic ratio of the at least one second metal to N can be from 0.4 to 0.6. In yet another embodiment, the second atomic ratio can be from 0.45 to 0.55.

The second component conductive metallic nitride layer 36L can be deposited, for example, by atomic layer deposition (ALD), physical vapor deposition (PVD) or chemical vapor deposition (CVD). The second component conductive metallic nitride layer 36L may, or may not, be conformal. The second component conductive metallic nitride layer 36L has a same composition throughout, which is herein referred to as a second composition. The second composition may be the same as the first composition. Specifically, the second atomic ratio is the same as the first atomic ratio, the at least one second metal can have the same set of at least one metal as the at least one first metal, and the atomic ratio among the at least one second metal (if multiple elements are present in the at least one second metal) is the same as the atomic ratio among the at least one first metal.

Alternately, the second composition may be different from the first composition by having a second atomic ratio that is different from the first atomic ratio, by having a different set of elements for, or a different atomic ratio among, the at least one second metal that the at least one first metal, or a combination thereof.

In one embodiment, the at least one second metal can be the same as the at least one first metal. In one embodiment, the at least one second metal and the at least one first metal can be a single elemental metal selected from Ti, Ta, and W. In another embodiment, the at least one second metal and the at least one first metal can be an alloy of at least two elemental metals selected from Ti, Ta, and W and having a same atomic ratio between/among the at least two elemental metals.

The thickness of the horizontal portions of the second component conductive metallic nitride layer 36L at the bottom of the first, second, and third gate cavities (25A, 25B, 25C) can be from 0.5 nm to 3.0 nm, although lesser and greater thicknesses can also be employed. In one embodiment, the combined thickness of the first and second component conductive metallic nitride layers (34L, 36L) can be from 1.0 nm to 6.0 nm, although lesser and greater thicknesses can also be employed.

In one embodiment, formation of the second component conductive metallic nitride layer 36L may be omitted, i.e., the processing step of FIG. 6 may be omitted.

Figure 7:
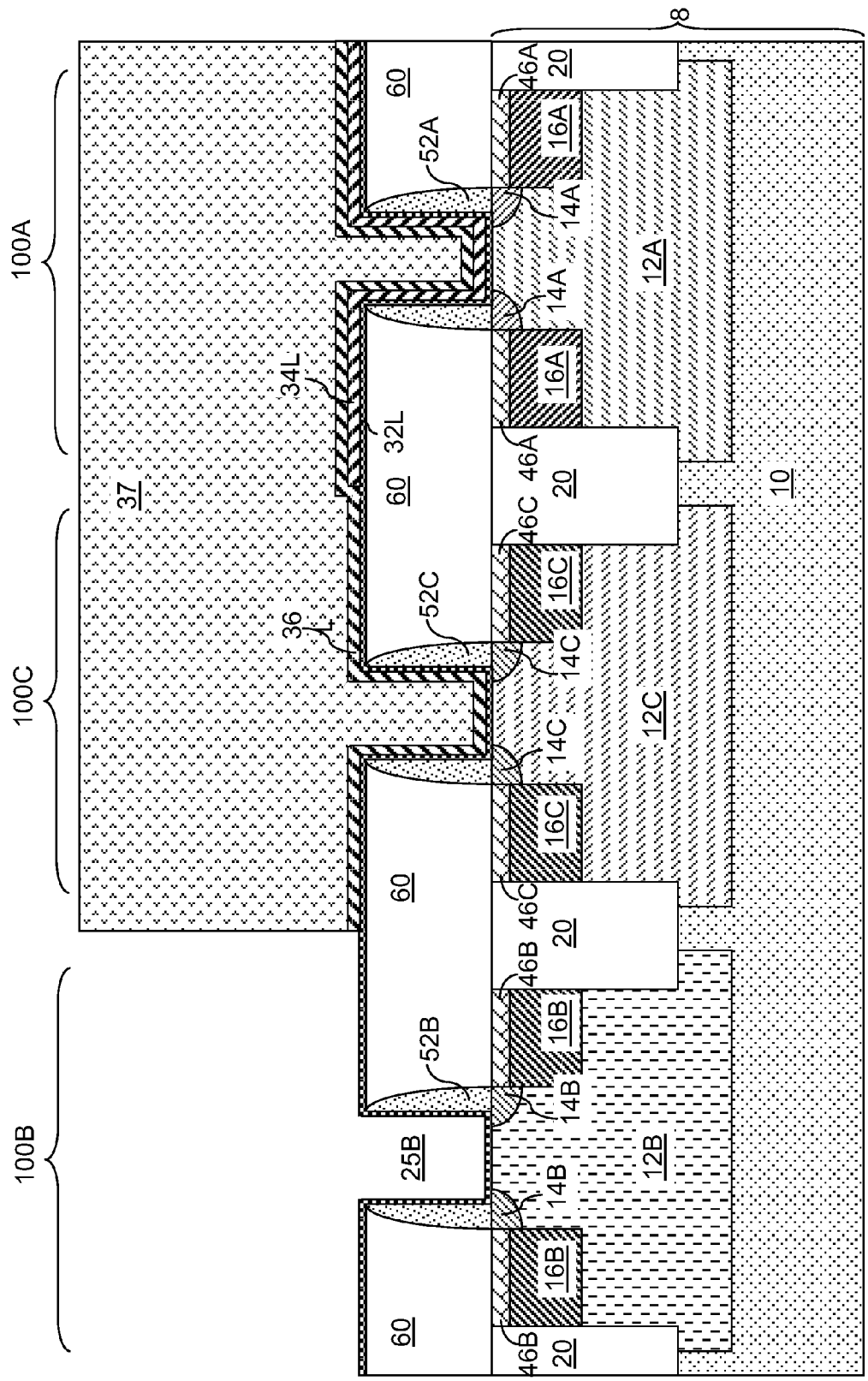
FIG. 7 is a vertical cross-sectional view of the first exemplary semiconductor structure after patterning of the second component conductive metallic nitride layer according to the first embodiment of the present disclosure.

Referring to FIG. 7, the second component conductive metallic nitride layer 36L is patterned so that the second component conductive metallic nitride layer 36L is removed from the second device region 100B, while a portion of the second component conductive metallic nitride layer 36L remains in the first device region 100A and another portion of the second component conductive metallic nitride layer 36L remains in the third device region 100C. For example, a second photoresist 37 can be applied and lithographic patterned so that the second photoresist 37 covers the area over the first doped well 12A in the first device region 100A and the third doped well 12C in the third device region 100C, while the first component conductive metallic nitride layer 34L is exposed, i.e., physically exposed, over the second doped well 12B in the second device region 100B. The exposed portion of the second component conductive metallic nitride layer 36L is removed by an etch, which can be a wet etch or a dry etch. Thus, the second component conductive metallic nitride layer 36L is removed from above a second portion of the gate dielectric layer 32L within the second gate cavity 25B, while the first component conductive metallic nitride layer 32L is not removed from above a first portion of the gate dielectric layer 32L within the first gate cavity 25A (See FIG. 6) or from above a third portion of the gate dielectric layer 32L within the third gate cavity 25C (See FIG. 6). The second photoresist 37 is subsequently removed, for example, by ashing or wet etching.

In an embodiment in which the processing step of FIG. 6 is omitted, the processing step of FIG. 7 is also omitted.

Figure 8:
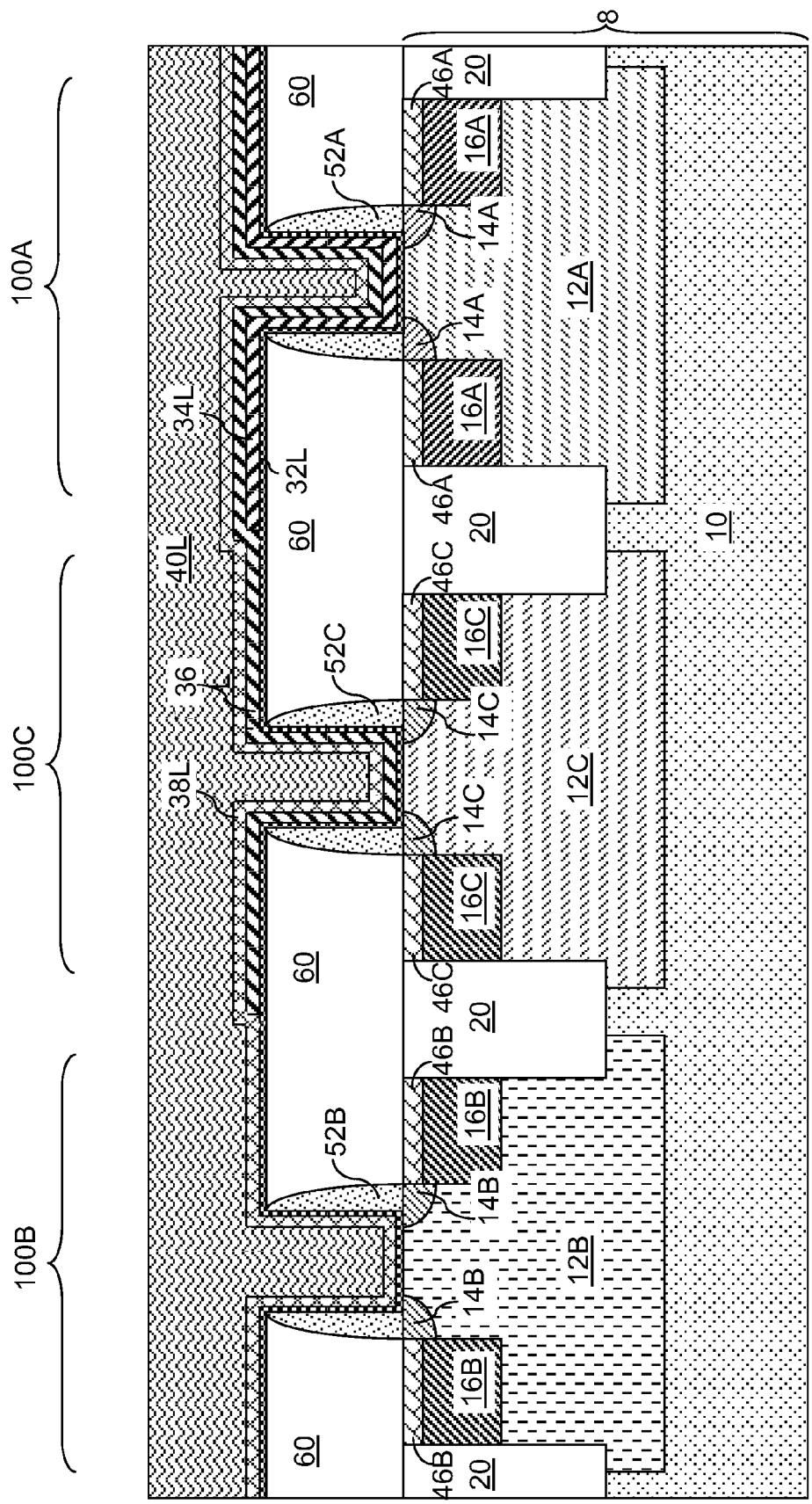
FIG. 8 is a vertical cross-sectional view of the first exemplary semiconductor structure after deposition of a third component conductive metallic nitride layer and a conductive material layer according to the first embodiment of the present disclosure.

Referring to FIG. 8, a third component conductive metallic nitride layer 38L is deposited on the exposed surfaces of the second component conductive metallic nitride layer 36L in the first and third device regions (100A, 100C) and on the exposed surfaces of the gate dielectric layer 32L in the second device region 100B. In one embodiment, the third component conductive metallic nitride layer 38L consists essentially of at least one third metal and N, and has a third atomic ratio of the at least one third metal to N. The at least one third metal can be an elemental metal of Ti, an elemental metal of Ta, an elemental metal of W, or any combination thereof. In one embodiment, the at least one third metal can be an identical set of a single metal or multiple metals as the at least one first metal and as the at least one second metal. For example, the at least one first metal, the at least one second metal, and the at least one third metal can be Ti, Ta, W, a set including Ti and Ta, a set including Ti and W, a set including Ta and W, or a set including Ti, Ta, and W. In another embodiment, the at least one third metal can be a set of a single metal or multiple metals that is different from the at least one first metal and/or different from the at least one second metal. For example, the at least one third metal may include an element selected from Ti, Ta, and W that is absent in the at least one first metal and/or at least one second metal, or may lack an element selected from Ti, Ta, and W that is present in the at least one first metal and/or at least one second metal. Further, if any two or more of the at least one first metal, the at least one second metal, and the at least one third metal include a plurality of elemental metals, the ratio among the plurality of elemental metals can be the same, or different, among the at least one first metal, the at least one second metal, and the at least one third metal.

In one embodiment, the third atomic ratio of the at least one third metal to N can be from 0.2 to 0.5. In another embodiment, the third atomic ratio of the at least one third metal to N can be from 0.4 to 0.6. In yet another embodiment, the third atomic ratio can be from 0.45 to 0.55.

The third component conductive metallic nitride layer 38L can be deposited, for example, by atomic layer deposition (ALD), physical vapor deposition (PVD) or chemical vapor deposition (CVD). The third component conductive metallic nitride layer 38L may, or may not, be conformal. The third component conductive metallic nitride layer 38L has a same composition throughout, which is herein referred to as a third composition. The third composition may be the same as the first composition.

The third atomic ratio can be the same as, or different from, the first atomic ratio. Thus, the third composition can have the same metal to N atomic ratio as the first composition, or may have a different metal to N atomic ratio from the first composition. The third atomic ratio can be the same as, or different from, the second atomic ratio. Thus, the third composition can have the same metal to N atomic ratio as the second composition, or may have a different metal to N atomic ratio from the second composition.

In one embodiment, the third composition may be different from the first composition. The third composition may be different from the first composition by having a third atomic ratio that is different from the first atomic ratio, by having a different set of elements for, or a different atomic ratio among, the at least one third metal that the at least one first metal, or a combination thereof.

In one embodiment, the third composition may be different from the second composition. The third composition may be different from the second composition by having a third atomic ratio that is different from the second atomic ratio, by having a different set of elements for, or a different atomic ratio among, the at least one third metal that the at least one second metal, or a combination thereof.

In one embodiment, the at least one third metal can be the same as the at least one first metal and the at least one second metal. In one embodiment, the at least one third metal, the at least one second metal, and the at least one first metal can be a single elemental metal selected from Ti, Ta, and W. In that case, the first atomic ratio, the second atomic ratio, and the third atomic ratio can be the same, or can be different from at least one of the other two atomic ratios. In another embodiment, the at least one third metal, the at least one second metal, and the at least one first metal can be an alloy of at least two elemental metals selected from Ti, Ta, and W and having a same atomic ratio between/among the at least two elemental metals. In that case, the first atomic ratio, the second atomic ratio, and the third atomic ratio can be the same, or can be different from at least one of the other two atomic ratios.

The thickness of the horizontal portions of the third component conductive metallic nitride layer 38L at the bottom of the first, second, and third gate cavities (25A, 25B, 25C; See FIG. 6) can be from 0.5 nm to 100 nm, although lesser and greater thicknesses can also be employed. In one embodiment, the combined thickness of the first and second component conductive metallic nitride layers (34L, 36L) can be from 1.5 nm to 6 nm, although lesser and greater thicknesses can also be employed.

Subsequently, the gate cavities are filled with a conductive material layer 40L. The conductive material layer 40L is deposited directly on the third component conductive metallic nitride layer 38L. The conductive material layer 40L includes a metal, which can be deposited by physical vapor deposition or chemical vapor deposition. The thickness of the conductive material layer 40L, as measured in a planar region of the conductive material layer 40L above the top surface of the planarization dielectric layer 60, can be from 100 nm to 500 nm, although lesser and greater thicknesses can also be employed. In one embodiment, the conductive material layer 40L includes at least one of W or Al. Further, the conductive material layer 40L can consist essentially of a single elemental metal such as W or Al. For example, the conductive material layer 40L can consist essentially of aluminum.

Figure 9:
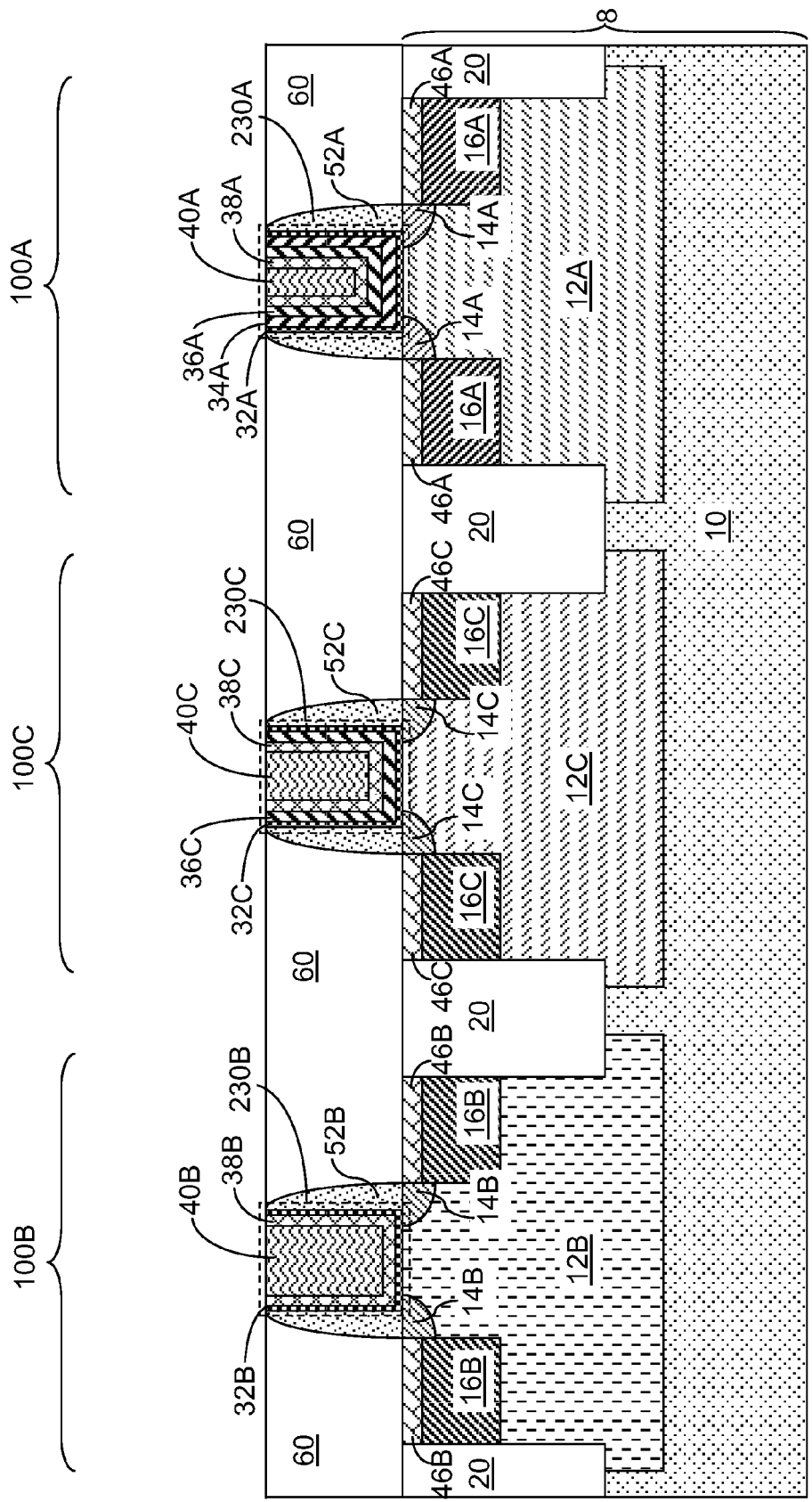
FIG. 9 is a vertical cross-sectional view of the first exemplary semiconductor structure after planarization according to an embodiment of the present disclosure.

Referring to FIG. 9, the conductive material layer 40L, the third component conductive metallic nitride layer 38L, the second component conductive metallic nitride layer 36L, the first component conductive metallic nitride layer 34L, and the gate dielectric layer 32L are planarized, for example, by chemical mechanical planarization. Specifically, portions of the conductive material layer 40L, the third component conductive metallic nitride layer 38L, the second component conductive metallic nitride layer 36L, the first component conductive metallic nitride layer 34L, and the gate dielectric layer 32L are removed from above the planar dielectric surface 63 of the planarization dielectric layer 60 at the end of the planarization step. The remaining portion of the gate dielectric layer 32L in the first device region 100A forms a first gate dielectric 32A, the remaining portion of the gate dielectric layer 32L in the second device region 100B forms a second gate dielectric 32B, and the remaining portion of the gate dielectric layer 32L in the third device region 100C forms a third gate dielectric 32C. The remaining portion of the first component conductive metallic nitride layer 34L in the first device region 100A forms a first-gate electrode first component conductive metallic nitride layer 34A. The remaining portion of the second component conductive metallic nitride layer 36L in the first device region 100A forms a first-gate electrode second component conductive metallic nitride layer 36A. The remaining portion of the second component conductive metallic nitride layer 36L in the third device region 100C forms a third-gate electrode second component conductive metallic nitride layer 36C. The remaining portion of the third component conductive metallic nitride layer 38L in the first device region 100A forms a first-gate electrode third component conductive metallic nitride layer 38A. The remaining portion of the third component conductive metallic nitride layer 38L in the second device region 100B forms a second-gate electrode third component conductive metallic nitride layer 38B. The remaining portion of the third component conductive metallic nitride layer 38L in the third device region 100C forms a third-gate electrode third component conductive metallic nitride layer 38C.

The stack of the first-gate electrode first component conductive metallic nitride layer 34A, the first-gate electrode second component conductive metallic nitride layer 36A, and the first-gate electrode third component conductive metallic nitride layer 38A collectively constitute a first conductive metallic nitride layer (34A, 36A, 38A) having a first thickness. The second-gate electrode third component conductive metallic nitride layer 38B constitutes a second conductive metallic nitride layer having a second thickness, which is less than the first thickness. The stack of the third-gate electrode second component conductive metallic nitride layer 36C and the third-gate electrode third component conductive metallic nitride layer 38C collectively constitute a third conductive metallic nitride layer (36C, 38C) having a third thickness, which is greater than the second thickness and is less than the first thickness. The topmost surfaces of the first, second, and third gate dielectrics (32A, 32B, 32C), the first conductive metallic nitride layer (34A, 36A, 38A), the second conductive metallic nitride layer 38B, the third conductive metallic nitride layer (36C, 38C), and the first, second, and third conductive material portions (40A, 40B, 40C) are coplanar with the topmost surface of the planarization dielectric layer 60.

Each of the first, second, and third gate dielectrics (32A, 32B, 32C) is a U-shaped gate dielectric, which includes a horizontal gate dielectric portion and vertical gate dielectric portions extending upward from peripheral regions of the horizontal gate dielectric portion. Each vertical gate dielectric portion contiguously extends from the horizontal gate dielectric portion to the topmost surface of the planarization dielectric layer 60.

The first conductive metallic nitride layer (34A, 36A, 38A) includes a first U-shaped conductive metallic nitride portion, which includes first conductive metallic nitride vertical portions and a first conductive metallic nitride horizontal portion. The second conductive metallic nitride layer 38B includes a second U-shaped conductive metallic nitride portion, which includes second conductive metallic nitride vertical portions and a second conductive metallic nitride horizontal portion. The third conductive metallic nitride layer (36C, 38C) includes a third U-shaped conductive metallic nitride portion, which includes third conductive metallic nitride vertical portions and a third conductive metallic nitride horizontal portion.

Thus, replacement gate stacks are formed within each volume previously occupied by the first, second, and third gate cavities (25A, 25B, 25C) at the step of FIG. 6. The replacement gate stacks include a first replacement gate stack 230A located in the first device region 100A, a second replacement gate stack 230B located in the second device region 100B, and a third replacement gate stack 230C located in the third device region 100C. Each replacement gate stack (230A, 230B, 230C) overlies a channel region of a field effect transistor. The first replacement gate stack 230A, the second replacement gate stack 230B, and the third replacement gate stack 230C are formed concurrently employing a same set of processing steps.

A first field effect transistor is formed in the first device region 100A. The first field effect transistor includes the first doped well 12A, the first source/drain extension regions 14A, the first source/drain regions 16A, the first metal semiconductor alloy portions 46A, the first replacement gate stack 230A, and the first gate spacer 52A. The first replacement gate stack 230A includes the first gate dielectric 32A, the first conductive metallic nitride layer (34A, 36A, 38A), and the first conductive material portion 40A. The first conductive metallic nitride layer (34A, 36A, 38A) and the first conductive material portion 40A collectively constitute a first gate electrode. The first gate dielectric 32A is in contact with the first conductive metallic nitride layer (34A, 36A, 38A).

A second field effect transistor is formed in the second device region 100B. The second field effect transistor includes the second doped well 12B, the second source/drain extension regions 14B, the second source/drain regions 16B, the second metal semiconductor alloy portions 46B, the second replacement gate stack 230B, and the second gate spacer 52B. The second replacement gate stack 230B includes the second gate dielectric 32B, the second conductive metallic nitride layer 38B, and the second conductive material portion 40B. The second conductive metallic nitride layer 38B and the second conductive material portion 40B collectively constitute a second gate electrode. The second conductive material portion 40B is in contact with the second conductive metallic nitride layer 38B, and has a same composition as the first conductive material portion 40A.

A third field effect transistor is formed in the third device region 100C. The third field effect transistor includes the third doped well 12C, the third source/drain extension regions 14C, the third source/drain regions 16C, the third metal semiconductor alloy portions 46C, the third replacement gate stack 230C, and the second gate spacer 52C. The third replacement gate stack 230C includes the third gate dielectric 32C, the third conductive metallic nitride layer (36C, 38C), and the third conductive material portion 40C. The third conductive metallic nitride layer (36C, 38C) and the third conductive material portion 40C collectively constitute a third gate electrode. The third gate dielectric 32C is in contact with the third conductive metallic nitride layer (36C, 38C), and has a same composition as the first and second conductive material portions (40A, 40B).

Each of the first, second, and third field effect transistors is a planar field effect transistor having a channel located underneath a topmost surface of the semiconductor substrate 8. Each of the first, second, and third field effect transistors can independently be a p-type field effect transistor or an n-type field effect transistor. In one embodiment, the different thicknesses of the conductive metallic nitride layers in different gate electrodes can provide different work functions having a range of about, or greater than, 400 mV.

In one embodiment, the first gate electrode can have a first work function that is closer to a valence band of silicon than a mid-band gap level of silicon, and the second gate electrode can have a second work function that is closer to a conduction band of silicon than the mid-band gap level of silicon. In one embodiment, the first field effect transistor can be a p-type field effect transistor, and the second field effect transistor can be an n-type field effect transistor.

In one embodiment, the third gate electrode can have a third work function that is closer to the mid-band gap level of silicon than to the conduction band of silicon or the valence band of silicon.

Figure 10:
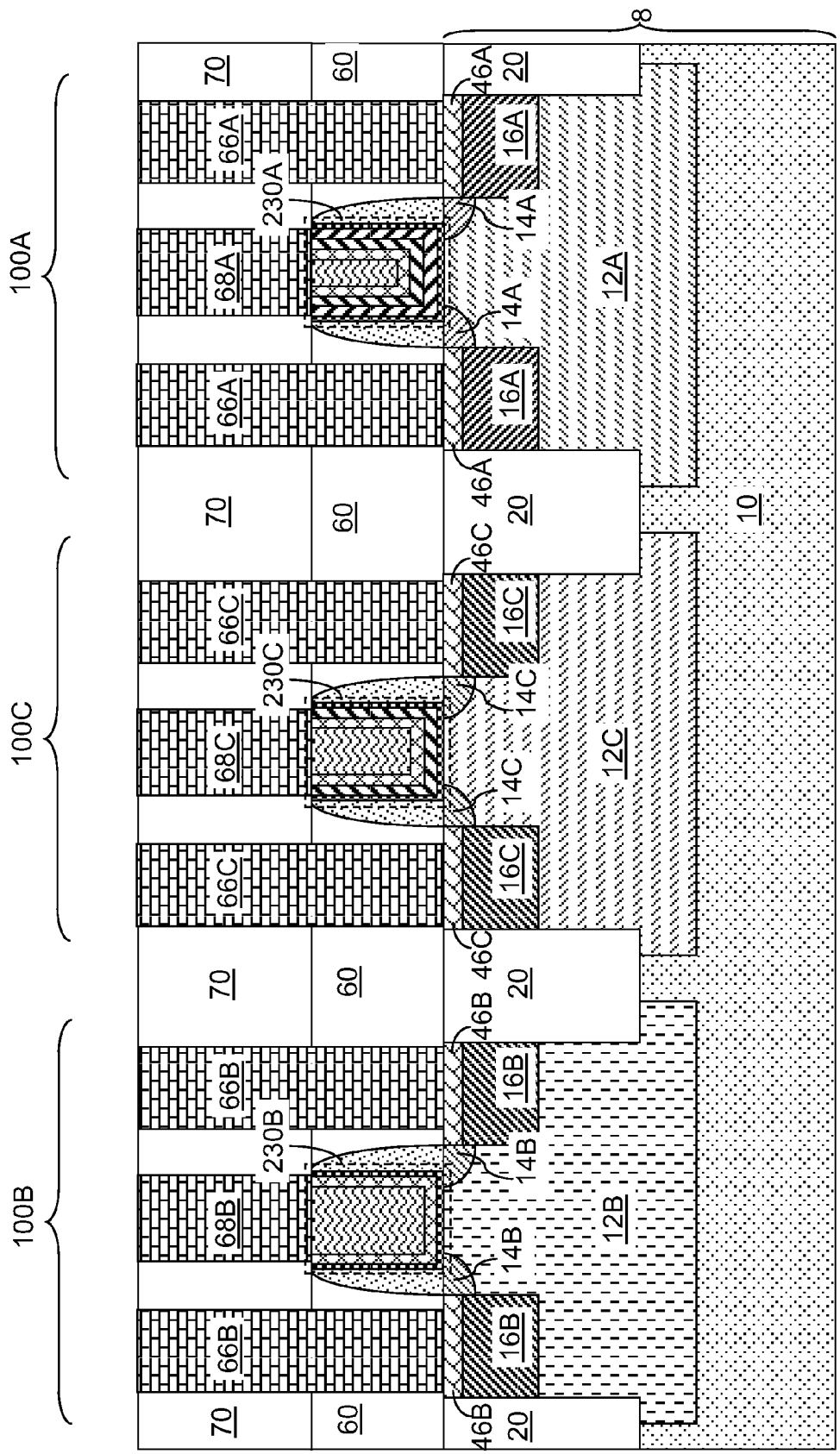
FIG. 10 is a vertical cross-sectional view of the first exemplary semiconductor structure after formation of a contact level dielectric layer and contact via structures according to the first embodiment of the present disclosure.

Referring to FIG. 10, a contact level dielectric layer 70 is deposited over the planarization dielectric layer 60. Various contact via structures can be formed, for example, by formation of contact via cavities by a combination of lithographic patterning and an anisotropic etch followed by deposition of a metal and planarization that removes an excess portion of the metal from above the contact level dielectric layer 70. The various contact via structures can include, for example, first source/drain contact via structures (i.e., at least one first source contact via structure and at least one first drain contact via structure) 66A, second source/drain contact via structures (i.e., at least one second source contact via structure and at least one second drain contact via structure) 66B, third source/drain contact via structures (i.e., at least one third source contact via structure and at least one third drain contact via structure) 66C, a first gate contact via structure 68A, a second gate contact via structure 68B, and a third gate contact via structure 68C. Each source contact via structure (66A, 66B, 66C) and each drain contact via structure (66A, 66B, 66C) are embedded in the planarization dielectric layer 60 and the contact level dielectric material layer 70. Each source contact via structure (one of 66A, 66B, 66C) contacts a source-side metal semiconductor alloy portion (one of 46A, 46B, 46C), and each drain contact via structure (another of 66A, 66B, 66C) contacts a drain-side metal semiconductor alloy portion (another of 46A, 46B, 46C).

Figure 11:
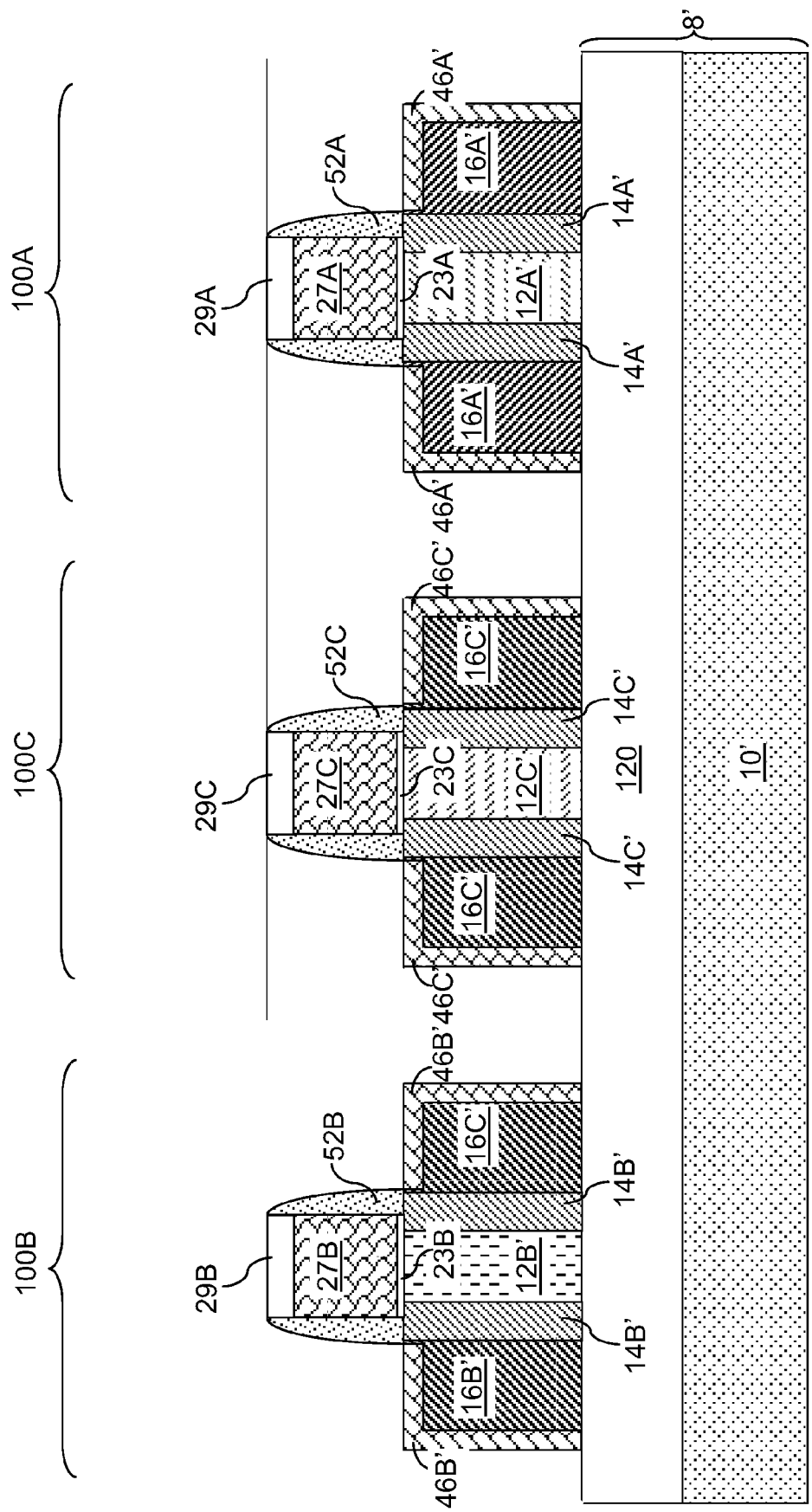
FIG. 11 is a vertical cross-sectional view of a second exemplary semiconductor structure after formation of semiconductor fins, disposable gate structures, source/drain extension regions, source/drain regions, and source/drain metal semiconductor alloy portions according to a second embodiment of the present disclosure.

Referring to FIG. 11, a second exemplary semiconductor structure can be formed, for example, by patterning a semiconductor-on-insulator (SOI) substrate. Specifically, an SOI substrate including a top semiconductor layer, a buried insulator layer 120, and a handle substrate 10' is provided. The top semiconductor layer is patterned to form a first semiconductor fin in a first device region 100A, a second semiconductor fin in a second device region 100B, and a third semiconductor fin in a third device region 100C.

Disposable gate stacks are formed on the first, second and third semiconductor fins employing the same method as in the first embodiment. Further, first source/drain extension regions 14A' are formed in the first semiconductor fin, second source/drain extension regions 14B' are formed in the second semiconductor fin, and third source/drain extension regions 14C' are formed in the third semiconductor fin. A first gate spacer 52A is formed around the first disposable gate structure (23A, 27A, 29A), a second gate spacer 52B is formed around the second disposable gate structure (23B, 27B, 29B), and a third gate spacer 52C is formed around the third disposable gate structure (23C, 27C, 29C). First source and drain regions 16A' are formed within the first semiconductor fin employing the first disposable gate structure (23A, 27A, 29A) and the first gate spacer 52A as a part of an implantation mask. Second source and drain regions 16A' are formed within the second semiconductor fin employing the second disposable gate structure (23B, 27B, 29B) and the second gate spacer 52B as a part of an implantation mask. Third source and drain regions 16C' are formed within the third semiconductor fin employing the third disposable gate structure (23C, 27C, 29C) and the third gate spacer 52C as a part of an implantation mask. Unimplanted portions of the semiconductor material within each semiconductor fin constitute a first body portion 12A', a second body portion 12B', and a third body portion 12C'. Various metal semiconductor alloy portions (46A', 46B', 46C') can be formed on the first, second, and third source and drain regions (16A'. 16B'. 16C') employing the same processing methods as in the first embodiment.

Figure 12:
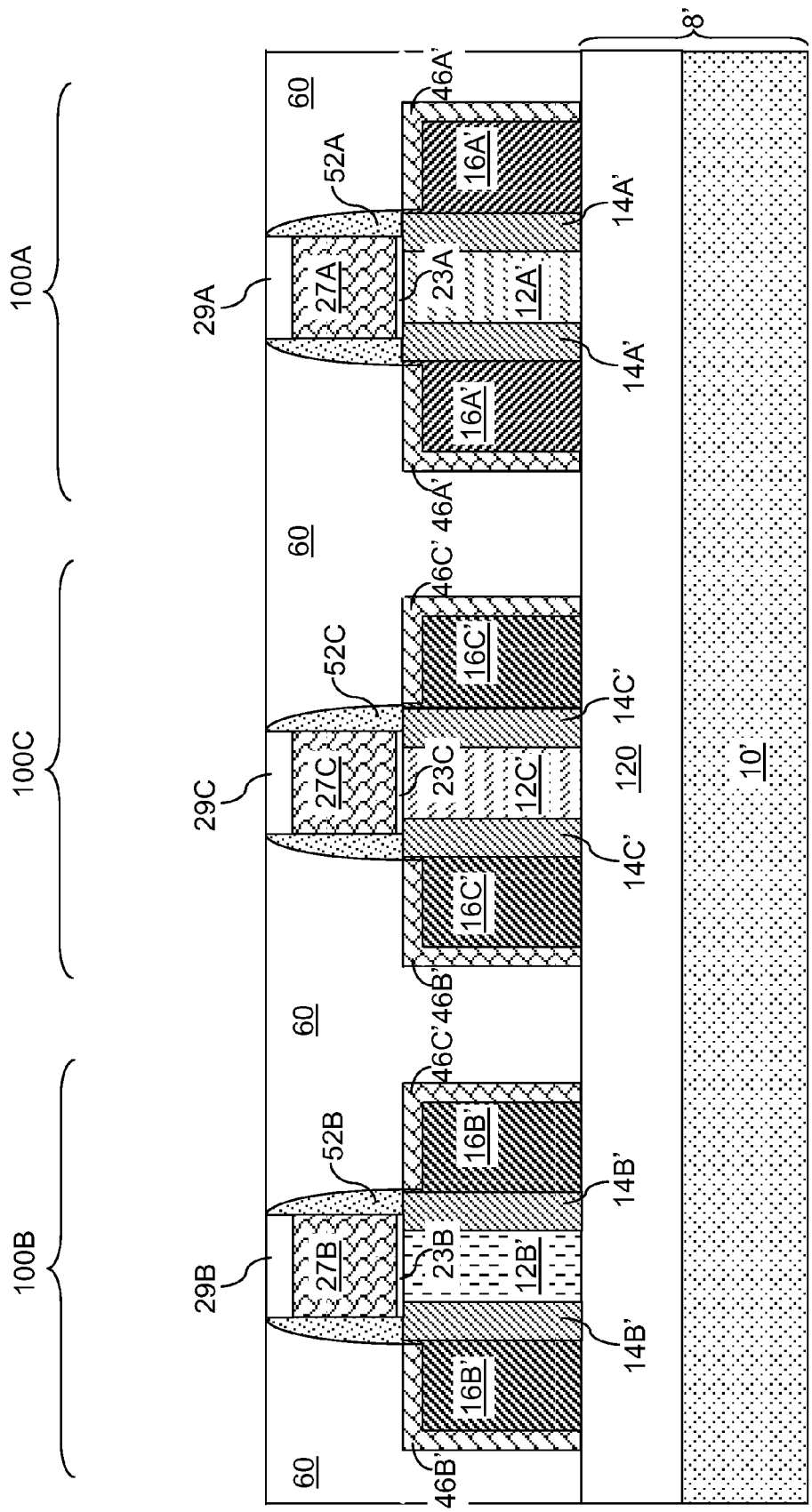
FIG. 12 is a vertical cross-sectional view of the second exemplary semiconductor structure after deposition and planarization of a planarization dielectric layer according to the second embodiment of the present disclosure.

Referring to FIG. 12, a planarization dielectric layer 60 is deposited over the semiconductor fins, the disposable gate structures, and the buried insulator layer 120 and planarized employing the same processing steps as in the first embodiment, i.e., the processing steps of FIG. 2.

Figure 13:
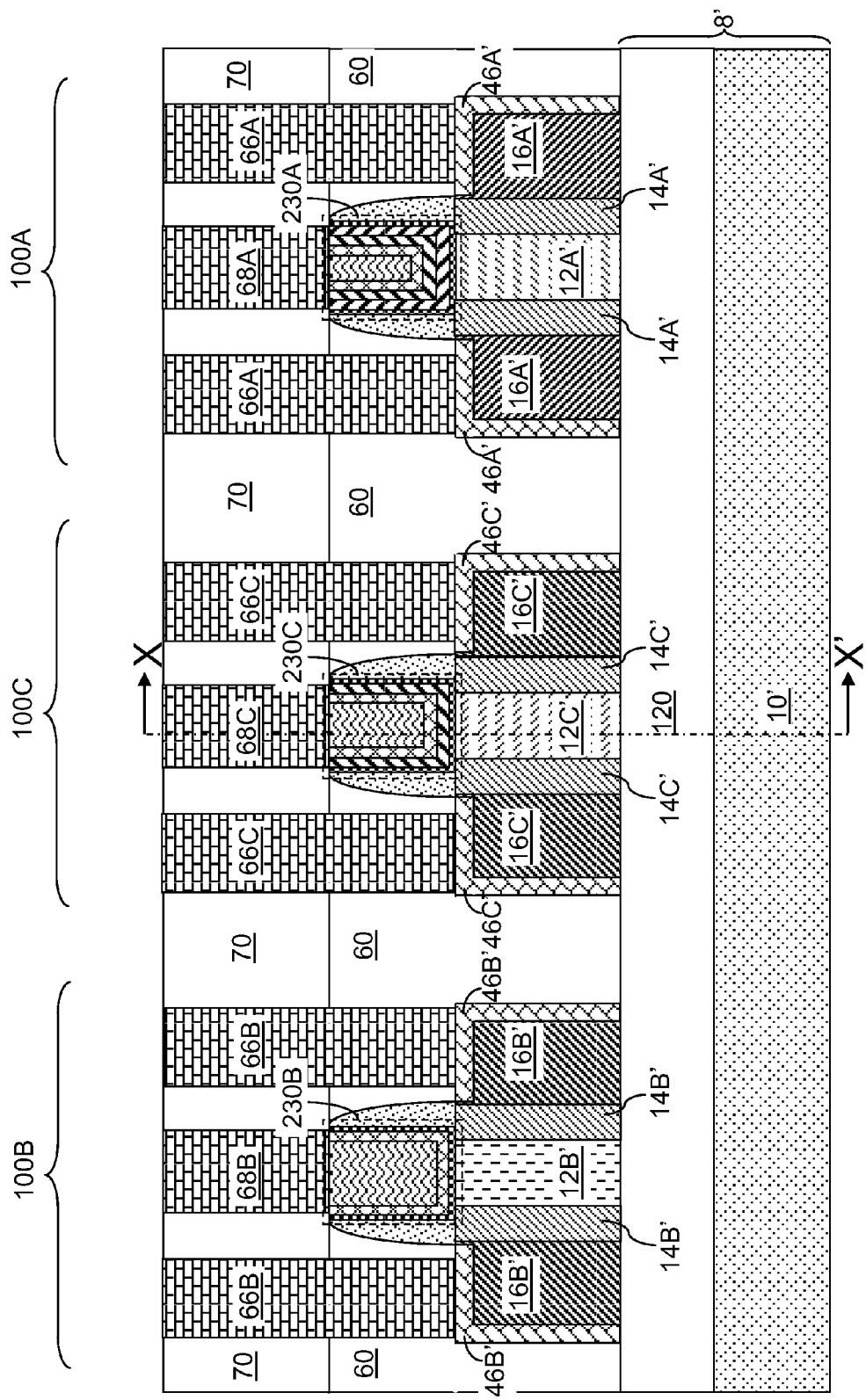
FIG. 13 is a vertical cross-sectional view of the second exemplary semiconductor structure after formation of a contact level dielectric layer and contact via structures according to the second embodiment of the present disclosure.
Figure 14:
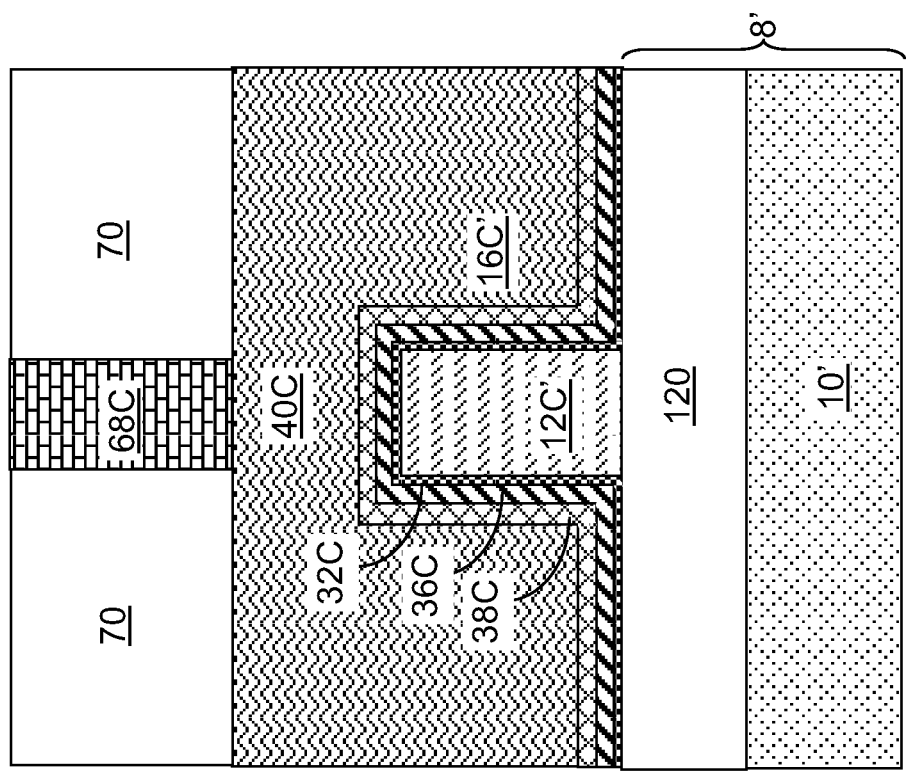
FIG. 14 is a vertical cross-sectional view of the second exemplary semiconductor structure of FIG. 13 along the vertical plane X-X' in FIG. 13.

Referring to FIGS. 13 and 14, the same processing steps can be performed as in the first embodiment to form the second exemplary semiconductor structure illustrated in FIGS. 13 and 14. The second exemplary semiconductor structure includes the same features as the first exemplary semiconductor structure of FIG. 10 except that each of said first, second, and third field effect transistors is a fin field effect transistor having a pair of channels located directly on sidewall portions of a semiconductor fin.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure, said method comprising:

forming a first gate cavity above a first semiconductor portion and a second gate cavity above a second semiconductor portion, wherein each of said first gate cavity and said second gate cavity is laterally surrounded by a planarization dielectric layer, wherein a top surface of each of first semiconductor material portion and second semiconductor portion is exposed at a bottom of each of said first and second gate cavities, and wherein each of the first and second semiconductor portions comprises a semiconductor fin having a metal semiconductor alloy located on said topmost surface and sidewall surfaces of said semiconductor fin;

forming a gate dielectric layer within said first and second gate cavities, wherein said gate dielectric layer comprises gate dielectric vertical portions located along an entirety of the sidewalls of each of said first and second gate cavities, and a gate dielectric horizontal portion having a bottommost surface in direct physical contact with said top surface of said semiconductor fin exposed at said bottom of each of said first and second gate cavities;

forming a component conductive metallic nitride layer along an entirety of said gate dielectric vertical portions and on said gate dielectric horizontal portion of said gate dielectric layer in both said first and second gate cavities;

removing said component conductive metallic nitride layer from above a second portion of said gate dielectric layer within said second gate cavity, while said component conductive metallic nitride layer is not removed from above a first portion of said gate dielectric layer within said first gate cavity;

forming another component conductive metallic nitride layer on said second portion of said gate dielectric layer and on a portion of said component conductive metallic nitride layer in contact with said first portion of said gate dielectric layer, wherein at least one of said component conductive metallic nitride layer and said another component conductive metallic nitride layer has a metal to nitrogen atomic ratio from 0.4 to 0.6, and wherein said metal is selected from the group consisting of Ti, Ta and combinations thereof;

filling said first gate cavity and said second gate cavity with a conductive material, wherein a first conductive material portion is formed within said first gate cavity and a second conductive material portion is formed within said second gate cavity; and forming a contact level dielectric layer located above said planarization dielectric layer, wherein said contact level dielectric layer includes a first contact via structure extending through an entirety of said contact level dielectric layer and directly contacting a topmost surface of said first conductive material portion, but not said gate dielectric vertical portions of said gate dielectric layer, in said first cavity, and a second contact via structure extending through said entirety of said contact level dielectric layer and directly contacting a topmost surface of said second conductive material portion, but not said gate dielectric vertical portions of said gate dielectric layer, in said second cavity.

2. The method of claim 1, further comprising:

forming first and second disposable gate structures on said first and second semiconductor portions prior to forming said planarization dielectric layer;

planarizing said planarization dielectric layer, wherein topmost surfaces of said first and second disposable gate structures are coplanar with a top surface of said planarization dielectric layer after said planarizing, and said first and second gate cavities are formed by removing said first and second disposable gate structures, respectively.

3. The method of claim 1, wherein said component conductive metallic nitride layer and said another component conductive metallic nitride layer have a same composition.

4. The method of claim 1, wherein said another component conductive metallic nitride layer has a different metal to N atomic ratio than said component conductive metallic nitride layer.

5. The method of claim 1, wherein said conductive material is deposited directly on said another component conductive metallic nitride layer.

6. The method of claim 1, further comprising performing a planarization process to remove said conductive material, said another component conductive metallic nitride layer, said component conductive metallic nitride layer, and said gate dielectric layer located outside said first and second gate cavities and atop said planarization dielectric layer, wherein after said planarization process topmost surfaces of said gate dielectric layer remaining in said first and second gate cavities are coplanar with a topmost surface of said conductive material remaining in said first and second gate cavities.

7. The method of claim 1, wherein both said component conductive metallic nitride layer and said another component conductive metallic nitride layer have said metal to nitrogen atomic ratio from 0.4 to 0.6.

8. The method of claim 1, wherein said component conductive metallic nitride layer has said metal to nitrogen atomic ratio from 0.4 to 0.6, and wherein said metal is selected from the group consisting of Ti, Ta and combinations thereof, and wherein said another conductive metal nitride has a metal to nitrogen atomic ratio from 0.2 to 0.5 or from 0.45 to 0.55, and said metal of said another conductive metal nitride is selected from at least one of Ti, Ta, and W.

9. The method of claim 1, wherein said another component conductive metallic nitride layer has said metal to nitrogen atomic ratio from 0.4 to 0.6, and wherein said metal is selected from the group consisting of Ti, Ta and combinations thereof, and wherein said conductive metal nitride has a metal to nitrogen atomic ratio from 0.2 to 5 or from 0.45 to 0.55, and said metal of said conductive metal nitride is selected from at least one of Ti, Ta, and W.

10. The method of claim 1, wherein said first conductive material portion is in contact with inner sidewalls and a horizontal surface of said another component conductive metallic nitride layer in said first gate cavity, and said second conductive material portion is in contact with inner sidewalls and a horizontal surface of said another component conductive metallic nitride layer in said second gate cavity.

11. The method of claim 10, wherein a combination of said first conductive metallic nitride layer and said first conductive material portion constitutes a first gate electrode having a first work function that is closer to a valence band of silicon than a mid-band gap level of silicon, and a combination of said second conductive metallic nitride layer and said second conductive material portion constitutes a second gate electrode having a second work function that is closer to a conduction band of silicon than said mid-band gap level of silicon.

12. A method of forming a semiconductor structure, said method comprising:
forming a first gate cavity above a first semiconductor portion and a second gate cavity above a second semiconductor portion, wherein each of said first gate cavity and said second gate cavity is laterally surrounded by a planarization dielectric layer, wherein a top surface of each of first semiconductor material portion and second semiconductor portion is exposed at a bottom of each of said first and second gate cavities, and wherein each of the first and second semiconductor portions comprises a semiconductor fin having a metal semiconductor alloy located on said topmost surface and sidewall surfaces of said semiconductor fin;
forming a gate dielectric layer within said first and second gate cavities, wherein said gate dielectric layer comprises gate dielectric vertical portions located along an entirety of the sidewalls of each of said first and second gate cavities, and a gate dielectric horizontal portion having a bottommost surface in direct physical contact with said top surface of said semiconductor fin exposed at said bottom of each of said first and second gate cavities;
forming a component conductive metallic nitride layer along an entirety of said gate dielectric vertical portions and on said gate dielectric horizontal portion of said gate dielectric layer in both said first and second gate cavities;
removing said component conductive metallic nitride layer from above a second portion of said gate dielectric layer within said second gate cavity, while said component conductive metallic nitride layer is not removed from above a first portion of said gate dielectric layer within said first gate cavity;
forming another component conductive metallic nitride layer on said second portion of said gate dielectric layer and on a portion of said component conductive metallic nitride layer in contact with said first portion of said gate dielectric layer, wherein at least one of said component conductive metallic nitride layer and said another component conductive metallic nitride layer has a metal to nitrogen atomic ratio from 0.45 to 0.55, and wherein said metal is selected from the group consisting of Ti, Ta, and combinations thereof;
filling said first gate cavity and said second gate cavity with a conductive material, wherein a first conductive material portion is formed within said first gate cavity and a second conductive material portion is formed within said second gate cavity; and
forming a contact level dielectric layer located above said planarization dielectric layer, wherein said contact level dielectric layer includes a first contact via structure extending through an entirety of said contact level dielectric layer and directly contacting a topmost surface of said first conductive material portion, but not said gate dielectric vertical portions of said gate dielectric layer, in said first cavity, and a second contact via structure extending through said entirety of said contact level dielectric layer and directly contacting a topmost surface of said second conductive material portion, but not said gate dielectric vertical portions of said gate dielectric layer, in said second cavity.

* * * * *